US011449305B2

(12) United States Patent
Yang et al.

(10) Patent No.: US 11,449,305 B2
(45) Date of Patent: Sep. 20, 2022

(54) PLAYING SOUND ADJUSTMENT METHOD AND SOUND PLAYING SYSTEM

(71) Applicant: Airoha Technology Corp., Hsinchu (TW)

(72) Inventors: Kuo-Ping Yang, Taipei (TW); Wei-Ming Chen, Taipei (TW); Po-Jui Wu, Taipei (TW); Wei-Ren Lan, Taipei (TW)

(73) Assignee: AIROHA TECHNOLOGY CORP., Hsinchu (TW)

( * ) Notice: Subject to any disclaimer, the term of this patent is extended or adjusted under 35 U.S.C. 154(b) by 0 days.

(21) Appl. No.: 17/170,944

(22) Filed: Feb. 9, 2021

(65) Prior Publication Data

US 2022/0091811 A1    Mar. 24, 2022

(30) Foreign Application Priority Data

Sep. 24, 2020  (CN) .......................... 202011016842.8

(51) Int. Cl.
| | |
|---|---|
| *H03G 5/00* | (2006.01) |
| *G06F 3/16* | (2006.01) |
| *H04R 3/04* | (2006.01) |
| *H03G 5/16* | (2006.01) |
| *G06V 40/16* | (2022.01) |

(52) U.S. Cl.
CPC ............ *G06F 3/165* (2013.01); *G06V 40/161* (2022.01); *H03G 5/165* (2013.01); *H04R 3/04* (2013.01); *G06V 40/178* (2022.01); *H04R 2430/01* (2013.01)

(58) Field of Classification Search
CPC ....................................................... H03G 5/00
See application file for complete search history.

(56) References Cited

U.S. PATENT DOCUMENTS

| | | | |
|---|---|---|---|
| 9,165,144 B1* | 10/2015 | Goldstein | G06F 21/60 |
| 9,330,589 B2* | 5/2016 | Cope | G09G 3/20 |
| 9,398,247 B2* | 7/2016 | Tateishi | H04N 21/42203 |
| 9,832,581 B1* | 11/2017 | Yang | H04R 29/001 |
| 2007/0271518 A1* | 11/2007 | Tischer | H04N 21/44222 |
| | | | 715/744 |
| 2016/0014540 A1* | 1/2016 | Kelly | H04S 7/303 |
| | | | 381/303 |
| 2016/0268989 A1* | 9/2016 | Nystrom | H04R 29/001 |
| 2017/0090584 A1* | 3/2017 | Tang | G06V 40/113 |
| 2017/0195815 A1* | 7/2017 | Christoph | H04R 5/02 |
| 2019/0354777 A1* | 11/2019 | Beck | G06V 20/52 |

* cited by examiner

*Primary Examiner* — Olisa Anwah
(74) *Attorney, Agent, or Firm* — McClure, Qualey & Rodack, LLP

(57) ABSTRACT

A method for adjusting playing sound in a sound playing system is disclosed. The sound playing system includes a camera module, a facial analysis module, a sound inputting module, a sound adjustment module, and a speaker. The method includes: obtaining an image of a face of each one of a plurality of people through the camera module; analyzing the image to estimate the age of each one of the plurality of people through the facial analysis module, and obtaining a target age according to the age of each person; obtaining a playing sound through the sound inputting module; adjusting the playing sound according to the target age through the sound adjustment module to obtain an output sound; and playing the output sound through the speaker.

9 Claims, 3 Drawing Sheets

PLAYING SOUND ADJUSTMENT METHOD AND SOUND PLAYING SYSTEM

BACKGROUND OF THE INVENTION

1. Field of the Invention

The present invention relates to a method for adjusting playing sound and a sound playing system, and more particularly, to a method and a sound playing system that can adjust the playing sound according to the age statistics of a plurality of listeners to make the sound easier to listen to.

2. Description of the Related Art

"Equalizer (EQ)" is a tool for adjusting sound, which can adjust the gain value of each frequency band. That is, the gain value of the sound (or audio file) at different frequencies can be adjusted to change the auditory effect produced by the output sound. For example, the blast sound presented in heavy bass makes it sound more powerful and realistic. Therefore, the equalizer is mainly used to adjust the output sound effect. Most of the existing computers also have equalizer applications installed, which can be used by the listener to adjust the sound of music for listening pleasure.

Regarding the adjustment of the gain value setting of the equalizer, usually a single user can use the equalizer to adjust the gain value of a frequency when listening to music, or there are multiple built-in modes, so that the user can directly select different modes to adjust multiple frequencies at the same time for entertainment. However, if there are multiple listeners, the auditory level of each listener is different; for example, there might be hearing loss for the elderly; therefore, the sound adjusted by a single user according to personal needs may not be suitable for multiple listeners.

Therefore, it is necessary to provide a new electronic device and method for adjust the playing sound to solve the deficiencies of the prior art.

SUMMARY OF THE INVENTION

It is an object of the present invention to provide a method and a sound playing system that can adjust the playing sound according to the age statistics of a plurality of listeners to make the sound easier to listen to.

In order to achieve the above object, the present invention discloses a method for adjusting playing sound in a sound playing system, the sound playing system includes a camera module, a facial analysis module, a sound inputting module, a sound adjustment module, and a speaker, wherein the method includes: obtaining an image of a face of each one of a plurality of people through the camera module; analyzing the image to estimate the age of each one of the plurality of people through the facial analysis module, and obtaining a target age according to the age of each person; obtaining a playing sound through the sound inputting module; adjusting the playing sound according to the target age through the sound adjustment module to obtain an output sound; playing the output sound through the speaker.

According to an embodiment of the present invention, wherein the sound adjustment module selects an equalizer target setting according to the target age to process the playing sound to obtain the output sound.

According to an embodiment of the present invention, wherein the sound adjustment module performs a frequency reduction adjustment by processing the playing sound according to the target age to obtain the output sound.

According to an embodiment of the present invention, wherein the target age is the oldest age among the plurality of people.

According to an embodiment of the present invention, wherein the target age is the average age of the plurality of people.

It is another object of the present invention to provide a sound playing system that can adjust the sound according to the age statistics of multiple listeners to make the sound easier to listen to.

In order to achieve the above object, the present invention discloses a sound playing system includes: a camera module, a facial analysis module, a sound inputting module, a sound adjustment module, and a speaker. The camera module obtains an image of a face of each one of a plurality of people. The facial analysis module analyzes the image to estimate the age of each one of the plurality of people, and obtains a target age according to the age of each person. The sound inputting module obtains a playing sound. The sound adjustment module adjusts the playing sound according to the target age to obtain an output sound. The speaker plays the output sound.

According to an embodiment of the present invention, wherein the sound playing system further includes a memory being electrically connected to the sound adjustment module and storing a plurality of equalizer target settings.

DETAILED DESCRIPTION OF THE PREFERRED EMBODIMENT

In order to make the structure and characteristics as well as the effectiveness of the present invention to be further understood and recognized, the detailed description of the present invention is provided as follows along with embodiments and accompanying figures.

Figure 1:
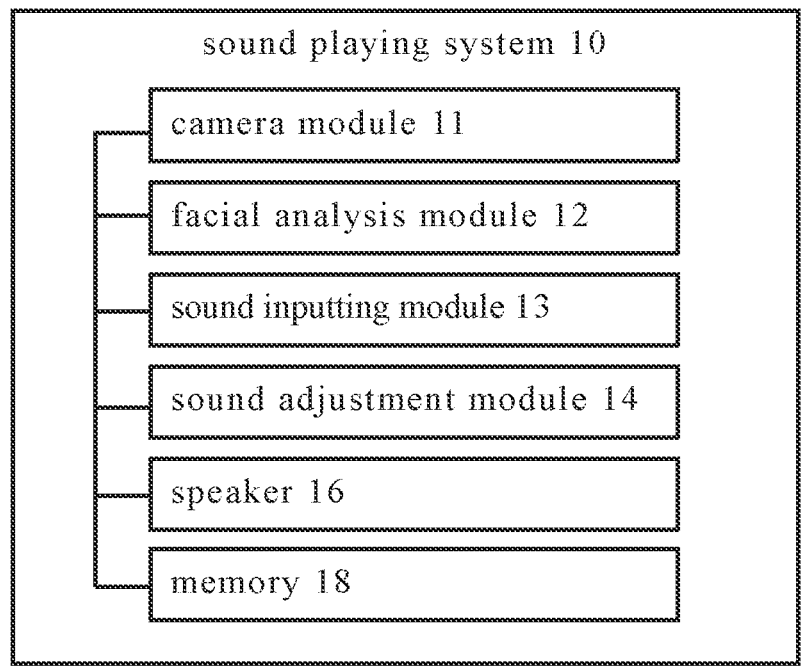
FIG. 1 illustrates a system structure diagram of a sound playing system according to an embodiment of the present invention.
Figure 2:
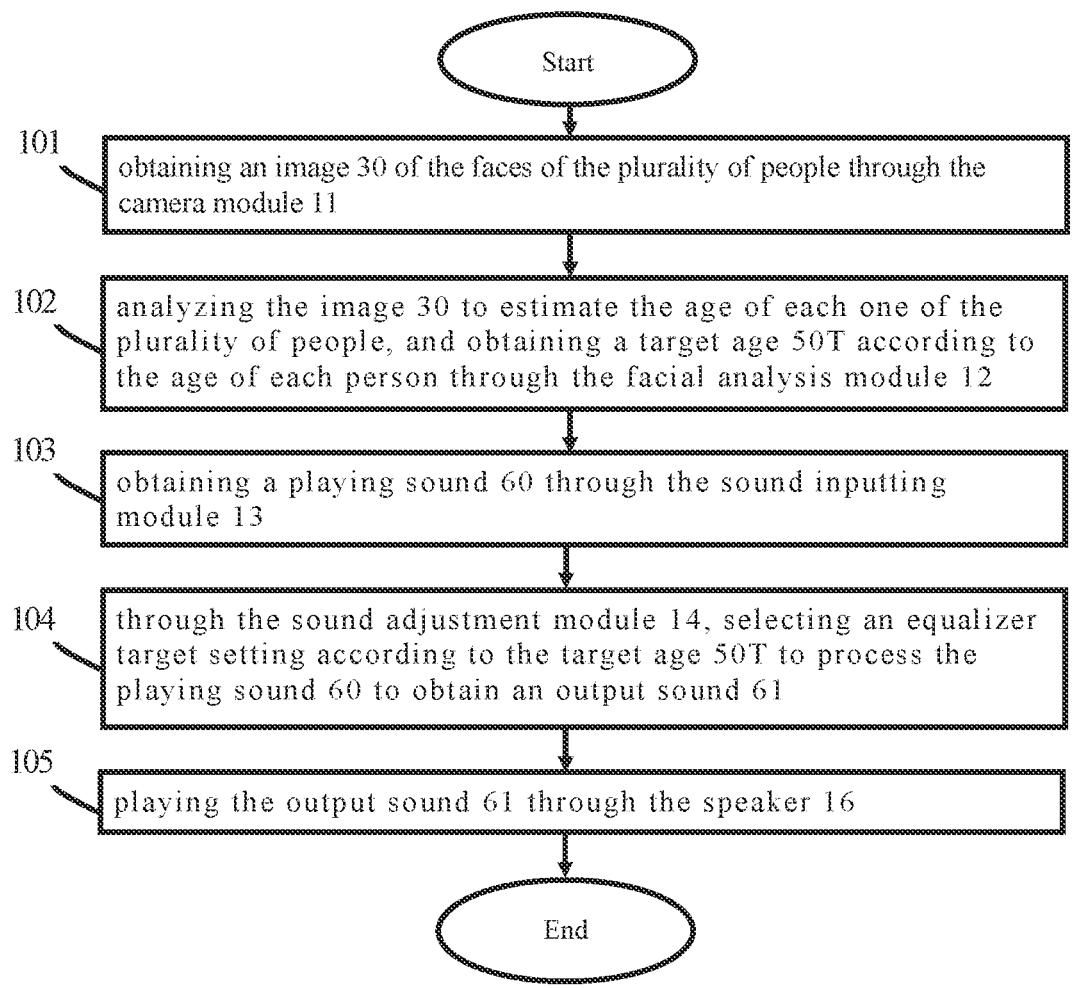
FIG. 2 illustrates a flowchart of a method for adjusting playing sound according to an embodiment of the present invention.
Figure 3:
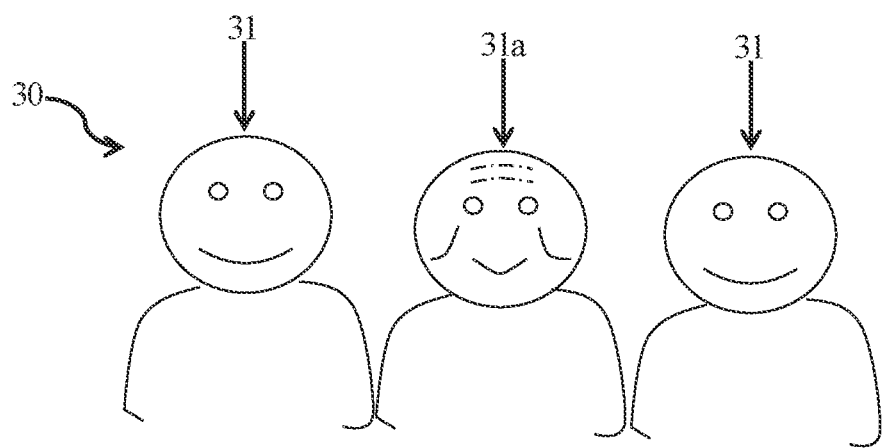
FIG. 3 illustrates a schematic diagram of an image obtained by a camera module according to an embodiment of the present invention.

Please refer to FIG. 1 to FIG. 3 for a sound playing system and a method for adjusting playing sound according to an embodiment of the present invention. FIG. 1 illustrates a system structure diagram of a sound playing system according to an embodiment of the present invention. FIG. 2 illustrates a flowchart of a method for adjusting playing sound according to an embodiment of the present invention. FIG. 3 illustrates a schematic diagram of an image obtained by a camera module according to an embodiment of the present invention.

As shown in FIG. 1 to FIG. 3, in an embodiment of the present invention, the method for adjusting the playing sound and the sound playing system 10 can be applied to occasions with multiple listeners (such as living room, conference room, movie theater, theater or concert hall), to adapt to the age statistics of multiple listeners, allowing the sound to be easier to listen to. The sound playing system 10 is, for example, a TV, stereo or other devices with a function of playing sound. The sound playing system 10 includes a camera module 11, a facial analysis module 12, a sound inputting module 13, a sound adjustment module 14, a speaker 16, and a memory 18.

In an embodiment of the present invention, the camera module 11 is, for example, a camera lens, which is used to obtain an image 30 of the faces of a plurality of people in the place where the sound playing system 10 is set. The image 30 contains the faces 31, 31a of the plurality of people. The camera module 11 can be built into a TV, audio or external equipment (such as a remote control or mobile phone). The facial analysis module 12 is, for example, a chip with an analysis function, which is used to analyze the image 30 obtained by the camera module 11, to estimate the age of each one of the plurality of people, and to obtain a target age 50T according to the age of each person. The target age 50T of the present invention is the eldest person among the plurality of people in the place where the sound playing system 10 is set; however, the design of the target age 50T is not limited to the above, the target age 50T can also be the average age of the plurality of people.

In an embodiment of the present invention, the sound inputting module 13 is, for example, an externally connected audio cable, which is used to obtain a playing sound 60 input is from the outside. The sound adjustment module 14 is, for example, a chip with a sound adjustment function, which is used to select a target setting of an equalizer to process the playing sound 60 according to the target age 50T obtained by the facial analysis module 12, to obtain an output sound 61.

In an embodiment of the present invention, the speaker 16 is electrically connected to the camera module 11, the facial analysis module 12, the sound inputting module 13, and the sound adjustment module 14, and the speaker 16 is used for playing output sound 61 processed by the sound adjustment module 14 for multiple people in the place where the playing sound system is set. The memory 18 is electrically connected to the sound adjustment module 14 and stores a plurality of equalizer target settings for the sound adjustment module 14 to select an equalizer target setting among the plurality of equalizer target settings from the memory 18 to process the playing sound 60. The plurality of target equalizer settings stored in memory 18 is as shown in the table below

|     | Freq (Hz) | | | | | | | |
| --- | --- | --- | --- | --- | --- | --- | --- | --- |
| age | 250 | 500 | 1K | 2K | 4K | 8K | 12.5K | 16K |
| 5~29 | 1.9 | 1.9 | 1.7 | 1.5 | 1.7 | 2.5 | 3.7 | 6.5 |
| 30~39 | 2.1 | 2.0 | 1.9 | 1.7 | 2.2 | 2.6 | 4.0 | 7.6 |
| 40~49 | 2.4 | 2.2 | 2.0 | 1.9 | 2.4 | 2.8 | 5.5 | 9.5 |
| 50~59 | 2.4 | 2.4 | 2.4 | 2.1 | 2.7 | 4.2 | 8.3 | 10.4 |
| 60~69 | 2.6 | 2.6 | 2.5 | 2.8 | 4.0 | 6.3 | 10.1 | 11.8 |
| 70~90 | 3.0 | 3.1 | 3.2 | 4.0 | 5.6 | 8.8 | 11.4 | 12.0 |

Each equalizer target setting includes an age range, and the compensation gain value corresponding to different frequencies such as 250 Hz, 500 Hz, 1 KHz, 2 KHz, 4 KHz, 8 KHz, 12.5 KHz, 16 KHz; for example, in the age range of 70~90, the frequencies 250 Hz, 500 Hz, 1 KHz, 2 KHz, 4 KHz, 8 KHz, 12.5 KHz, 16 KHz correspond to the compensation gain values of 3.0, 3.1, 3.2, 4.0, 5.6, 8.8, 11.4, 12.0 respectively, so if the sound adjustment module 14 uses the equalizer target setting for the age range of 70~90 to process the sound, the listeners will hear the frequencies 250 Hz, 500 Hz, 1 KHz, 2 KHz, 4 KHz, 8 KHz, 12.5 KHz, 16 KHz with compensation gain values of 3.0, 3.1, 3.2, 4.0, 5.6, 8.8, 11.4, 12.0 respectively. However, it is noted that the various values of the above-mentioned equalizer target settings are only examples. The age range is not limited to the above. The age range can be changed according to design requirements, for example, modified to one age range in every five year. In addition, the numerical limit of the compensation gain value is not limited thereto. The numerical limit of the compensation gain value can also be a negative number. Then the sound adjustment module 14 will process the playing sound 60 accordingly to perform frequency reduction adjustments to obtain the reduced frequency to obtain the output sound 61.

In an embodiment of the present invention, the method for adjusting the playing sound is programmed as a software program and stored in the memory 18. When performing the method for adjusting the playing sound of the present invention, the sound playing system 10 will execute the software program of the method for adjusting the playing sound to perform step 101: obtaining an image 30 of the faces of the plurality of people through the camera module 11.

In an embodiment of the present invention, the camera module 11 takes a picture of the faces of three people in the place where the sound playing system 10 is set to obtain the image 30 of the faces of the three people, and there are the faces 31, 31a of the three people in the image 30. The camera module 11 sends the captured image 30 to the facial analysis module 12.

Then, the sound playing system 10 will execute step 102: analyzing the image 30 to estimate the age of each one of the plurality of people, and obtaining a target age or according to the age of each person through the facial analysis module 12.

After the facial analysis module 12 receives the image 30 of the faces of the three people captured by the camera module 11, the facial analysis module 12 analyzes the image 30 to estimate the age of each one of the three people, and obtains a target age of 50T according to each person's age. The target age 50T is the eldest person among the plurality of people in the place where the sound playing system 10 is set. In an embodiment of the present invention, the facial analysis module 12 estimates the age of each person based on the appearance features of the face 31, 31a, such as wrinkles, eye bags, and hair color. Therefore, the facial analysis module 12 estimates the age of the corresponding person as 35 years old based on the face 31, and estimates the age of the corresponding person as 65 years old based on the face 31a; thus, the target age 50T is set to be 65 years old of the eldest person.

Then, the sound playing system 10 will execute step 103: obtaining a playing sound 60 through the sound inputting module 13.

In an embodiment of the present invention, the audio cable of the sound inputting module 13 obtains a playing sound 60 such as music, human voice, dubbing of a movie from an external source. The sound inputting module 13 transmits the received playing sound 60 to the sound adjustment module 14.

Then, the sound playing system 10 will execute step 104: through the sound adjustment module 14, selecting an equalizer target setting according to the target age 50T to process the playing sound 60 to obtain an output sound 61.

In an embodiment of the present invention, the sound adjustment module 14 selects the corresponding equalizer target setting from the plurality of equalizer target settings stored in the memory 18 according to the target age 50T of 65 years old to process the playing sound 60. Since the target age 50T is 65 years old, the equalizer target setting selected by the sound adjustment module 14 is the setting corresponding to the age range of 60~69 years, that is, the frequencies are 250 Hz, 500 Hz, 1 KHz, 2 KHz, 4 KHz, 8 KHz, 12.5 KHz, 16 KHz corresponding to compensation gain values of 2.6, 2.6, 2.5, 2.8, 4.0, 6.3, 10.1, 11.8 respectively. Therefore, the playing sound 60 is processed by the sound adjustment module 14 to have different compensation gain values for each frequency, and an output sound 61 suitable for listening by people in the 60-69 age range is obtained, so that the 65-year-old person can listen to the playing sound clearly.

However, if the target age 50T is designed to be the average age of a plurality of people, the target age 50T will be 45 years old. Therefore, the equalizer target setting selected by the sound adjustment module 14 corresponds to the setting of the 40~49 years old age range, and the playing sound 60 is processed into an output sound 61 suitable for people in the 40-49 age range to listen to, so that the playing sound 60 can be heard clearly by as many people as possible.

Finally, the sound playing system 10 will execute step 105: playing the output sound 61 through the speaker 16.

The sound adjustment module 14 will transmit the output sound 61 to the speaker 16, and the speaker 16 will play the output sound 61 for the three people in the place where the sound playing system 10 is set. Since the output sound 61 has been adjusted to be suitable for people in the 60-69 age range, among the three people in the place where the sound playing system 10 is set, the 65-year-old person, who is the eldest one, can hear the adjusted output sound 61 clearly.

The method for adjusting playing sound and the sound playing system 10 of the present invention can be applied to occasions with multiple listeners to adjust the played sound according to the age statistics of multiple listeners, so that the sound can be heard by the eldest person among multiple listeners, or by as many people as possible, making the sound easier for the listener to listen to.

It should be noted that although the present invention is disclosed above by embodiments, the embodiments are not restrictive of the present invention. Equivalent implementation of, or equivalent changes made to without departing from the spirit of the present invention must be deemed falling within the scope of the present invention. Accordingly, the legal protection for the present invention should be defined by the appended claims.

What is claimed is:

1. A method for adjusting playing sound, applied to a sound playing system, wherein the sound playing system comprises a camera module, a facial analysis module, a sound inputting module, a sound adjustment module, and a speaker, the method comprising:
   obtaining an image of a face of each one of a plurality of people through the camera module;
   analyzing the image to estimate an age of each one of the plurality of people through the facial analysis module, and obtaining a target age according to the age of each person;
   obtaining a playing sound through the sound inputting module;
   adjusting the playing sound according to the target age through the sound adjustment module to obtain an output sound; and
   playing the output sound through the speaker,
   wherein the sound adjustment module selects an equalizer target setting according to the target age to process the playing sound to obtain the output sound.

2. The method for adjusting playing sound as claimed in claim 1, wherein the sound adjustment module performs a frequency reduction adjustment by processing the playing sound according to the target age to obtain the output sound.

3. The method for adjusting playing sound as claimed in claim 1, wherein the target age is the oldest age among the plurality of people.

4. The method for adjusting playing sound as claimed in claim 1, wherein the target age is an average age of the plurality of people.

5. A sound playing system comprising:
   a camera module for obtaining an image of a face of each one of a plurality of people;
   a facial analysis module for analyzing the image to estimate an age of each one of the plurality of people, and obtaining a target age according to the age of each person;
   a sound inputting module for obtaining a playing sound;
   a sound adjustment module for adjusting the playing sound according to the target age to obtain an output sound; and
   a speaker for playing the output sound,
   wherein the sound adjustment module selects an equalizer target setting according to the target age to process the playing sound to obtain the output sound.

6. The sound playing system as claimed in claim 5, wherein the sound adjustment module performs a frequency reduction adjustment by processing the playing sound according to the target age to obtain the output sound.

7. The sound playing system as claimed in claim 5, wherein the sound playing system further comprises a memory being electrically connected to the sound adjustment module and storing a plurality of equalizer target settings.

8. The sound playing system as claimed in claim 5, wherein the target age is the oldest age among the plurality of people.

9. The sound playing system as claimed in claim 5, wherein the target age is an average age of the plurality of people.

* * * * *